(12) United States Patent
Eurlings et al.

(10) Patent No.: US 6,875,545 B2
(45) Date of Patent: Apr. 5, 2005

(54) METHOD OF REMOVING ASSIST FEATURES UTILIZED TO IMPROVE PROCESS LATITUDE

(75) Inventors: Markus Franciscus Antonius Eurlings, Tilburg (NL); Jang Fung Chen, Cupertino, CA (US); Duan-Fu Stephen Hsu, Freemont, CA (US)

(73) Assignee: ASML Masktools B.V., Veldhoven (NL)

( * ) Notice: Subject to any disclaimer, the term of this patent is extended or adjusted under 35 U.S.C. 154(b) by 91 days.

(21) Appl. No.: 10/305,364

(22) Filed: Nov. 27, 2002

(65) Prior Publication Data

US 2003/0170565 A1 Sep. 11, 2003

Related U.S. Application Data

(60) Provisional application No. 60/333,503, filed on Nov. 28, 2001.

(51) Int. Cl.[7] ..................... H01L 21/027; G02B 31/00; G03F 7/20
(52) U.S. Cl. ..................... 430/5; 430/270.11; 430/302; 355/67
(58) Field of Search ............................. 430/5, 270.11, 430/302; 355/37

(56) References Cited

U.S. PATENT DOCUMENTS

| | | | |
|---|---|---|---|
| 5,340,700 A | | 8/1994 | Chen et al. |
| 5,424,154 A | | 6/1995 | Borodovsky |
| 5,900,340 A | | 5/1999 | Reich et al. |
| 6,519,760 B2 | * | 2/2003 | Shi et al. .................. 716/19 |
| 6,553,562 B2 | | 4/2003 | Capodieci et al. |
| 2002/0004175 A1 | * | 1/2002 | Levenson ................. 430/5 |
| 2002/0192570 A1 | * | 12/2002 | Smith ...................... 430/5 |

FOREIGN PATENT DOCUMENTS

| | | |
|---|---|---|
| EP | 1 091 252 A2 | 4/2001 |
| EP | 0 750 231 B1 | 6/2001 |
| EP | 1 316 851 A3 | 1/2004 |

OTHER PUBLICATIONS

S. Manakli et al., "Complementary Double Exposure Technique (CODE): a way to print 80nm gate level using a double exposure binary mask approach", XP–02257320, Optical Microlithography XV, SPIE, vol. 4691, (2002), pp. 491–502.

(Continued)

*Primary Examiner*—John L Goodrow
(74) *Attorney, Agent, or Firm*—McDermott Will & Emery LLP

(57) ABSTRACT

A method of transferring a lithographic pattern onto a substrate by use of a lithographic apparatus. The method includes the steps of: (1) defining features to be printed on the substrate; (2) determining which of the features require assist features to be disposed adjacent thereto in order for the features to be printed within defined resolution limits; (3) generating a mask containing the features to be printed and the assist features; (4) performing a first illumination process so as to print the features on the substrate, the first illumination process resulting in the partial printing of the assist features on the substrate; and (5) performing a second illumination process so as to reduce the amount of the assist features printed on the substrate; the second illumination process entails the step of performing a quadrapole illumination.

16 Claims, 9 Drawing Sheets

OTHER PUBLICATIONS

J.S. Petersen, "Optical proximity strategies for desensitizing lens aberrations", XP-002257321, pp. 254–265.

A. Kroyan et al., "Effects of Sub-Resolution Assist Features on Depth of Focus and Uniformity of Contact Windows for 193 nm Lithography", XP-001083867, Part of the SPIE Conference on Optical Microlithography XII, SPIE, vol. 3679, Mar. 1999, pp. 630–638.

R. Socha et al., "Forbidden Pitches for 130nm lithography and below", XP-009018640, Optical Microlithography XIII, Proceedings of SPIE, vol. 4000, (2000), pp. 1140–1155.

N. Kachwala et al., "Imaging contrast improvement for 160nm line features using sub resolution assist features with binary, 6% ternary attenuated phase shift mask with process tuned resist", XP-002257322, pp. 55–67.

J.A. Torres et al., "Model Assisted Double Dipole Decomposition", Optical Micolithography XV, Proceedings of SPIE vol. 4691, (2002), XP-002257323, pp. 407–417.

* cited by examiner

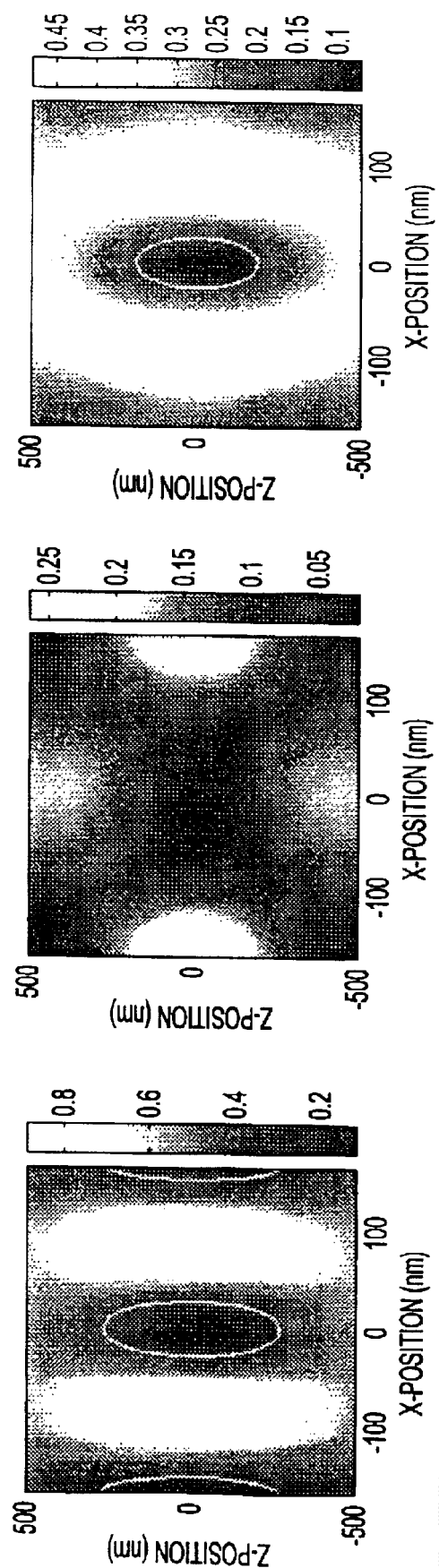

METHOD OF REMOVING ASSIST FEATURES UTILIZED TO IMPROVE PROCESS LATITUDE

This application claims the benefit of provisional application No. 60/333,503, filed Nov. 28, 2001.

The present invention relates to photolithography and more particularly to optical proximity correction methods used during the development of photolithography masks for use in lithographic apparatus comprising:

a radiation system for supplying a projection beam of radiation;

a support structure for supporting patterning means, the patterning means serving to pattern the projection beam according to a desired pattern;

a substrate table for holding a substrate; and a projection system for projecting the patterned beam onto a target portion of the substrate.

The term "patterning means" as herein employed should be broadly interpreted as referring to means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning means include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transitive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described herein, the patterning means can comprise one or more programmable mirror arrays. More information on mirror arrays as here referred to can be gleaned, for example, from U.S. Pat. No. 5,296,891 and U.S. Pat. No. 5,523,193, and PCT patent applications WO 98/38597 and WO 98/33096, which are incorporated herein by reference. In the case of a programmable mirror array, the said support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning means as herein set forth.

Lithographic projection apparatus can be used, for example, in the manufacture of integrated circuits (ICs). In such a case, the patterning means may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, incorporated herein by reference.

As semiconductor manufacturing technology is quickly pushing towards the limits of optical lithography, the state-of-the-art processes to date have regularly produced ICs with features exhibiting critical dimensions ("CDs") which are below the exposure wavelength ("$\lambda$"). A "critical dimension" of a circuit is defined as the smallest width of a feature or the smallest space between two features. For feature patterns that are designed to be smaller than $\lambda$, it has been recognized that the optical proximity effect (OPE) becomes much more severe, and in fact becomes intolerable for leading edge sub-$\lambda$ production processes.

Optical proximity effects are a well known characteristic of optical projection exposure tools. More specifically, proximity effects occur when very closely spaced circuit patterns are lithographically transferred to a resist layer on a wafer. The light waves of the closely spaced circuit features interact, thereby distorting the final transferred pattern features. In other words, diffraction causes adjacent features to interact with each other in such a way as to produce pattern dependent variations. The magnitude of the OPE on a given feature depends on the feature's placement on the mask with respect to other features.

One of the primary problems caused by such proximity effects is an undesirable variation in feature CDs. For any leading edge semiconductor process, achieving tight control over the CDs of the features (i.e., circuit elements and interconnects) is typically the primary manufacturing goal, since this has a direct impact on wafer sort yield and speed-binning of the final product.

It has been known that the variations in the CDs of circuit features caused by OPE can be reduced by several methods. One such technique involves adjusting the illumination characteristics of the exposure tool. More specifically, by carefully selecting the ratio of the numerical aperture of the illumination condenser ("NAc") to the numerical aperture of the imaging objective lens ("NAo") (this ratio has been referred to as the partial coherence ratio—$\sigma$), the degree of OPE can be manipulated to some extent.

In addition to using relatively incoherent illumination, such as described above, OPE can also be compensated for by "pre-correcting" the mask features. This family of techniques is generally known as optical proximity correction (OPC) techniques.

For example, in U.S. Pat. No. 5,242,770 (the '770 patent), which is hereby incorporated by reference, the method of using scattering bars (SBs) for OPC is described. The '770 patent demonstrates that the SB method is very effective for modifying isolated features so that the features behave as if the features are dense features. In so doing, the depth of focus (DOF) for the isolated features is also improved, thereby significantly increasing process latitude. Scattering bars (also known as intensity leveling bars or assist bars) are correction features (typically non-resolvable by the exposure tool) that are placed next to isolated feature edges on a mask in order to adjust the edge intensity gradients of the isolated edges. Preferably, the adjusted edge intensity gradients of the isolated edges match the edge intensity gradients of the dense feature edges, thereby causing the SB-assisted isolated features to have nearly the same width as densely nested features.

It is generally understood that the process latitude associated with dense structures is better than that associated with isolated structures under conventional illumination for large feature sizes. However, recently, more aggressive illumination schemes such as annular illumination and multipole illumination have been implemented as a means of improving resolution and known OPC techniques have not always had the desired effects with such illumination schemes.

Furthermore, when printing features having semi-dense pitches, often times the depth of focus is degraded as a result of a "forbidden pitch". This problem is especially present when utilizing strong off-axis illumination such as dipole illumination. The forbidden pitch problem has been described in detail in U.S. patent application Ser. No. 09/840,305 filed Apr. 24, 2001, which is herein incorporated by reference. As disclosed in the '305 application, it is possible to negate the effects of the forbidden pitch problem and improve the DOF by inserting assist features (AF) into the mask design. However, the use of such resist features often results in the printing of unwanted residues on the wafer. As a result, the use of the AFs does not always provide a viable solution to the forbidden pitch problem.

SUMMARY OF THE INVENTION

Accordingly, it is an object of the present invention to provide a method which allows for the use of the AFs and which effectively eliminates the unwanted residues of AFs from the wafer without degrading the overall process latitude.

More specifically, the present invention relates to a method of transferring a lithographic pattern onto a substrate by use of a lithographic apparatus. The method includes the steps of: (1) defining features to be printed on the substrate; (2) determining which of the features require assist features to be disposed adjacent thereto in order for the features to be printed within defined resolution limits; (3) generating a mask containing the features to be printed and the assist features; (4) performing a first illumination process so as to print the features on the substrate, the first illumination process resulting in the partial printing of the assist features on the substrate; and (5) performing a second illumination process so as to reduce the amount of the assist features printed on the substrate; the second illumination process includes the step of performing a quadrapole illumination utilizing a dedicated reticle (or reticle section).

In the preferred embodiment, the present invention utilizes a QUASAR™ illumination in the second illumination process in order to remove the assist features. As is known and described in U.S. patent application Ser. No. 09/287,014 filed on Apr. 6, 1999, which is hereby incorporated by reference, a QUASAR™ illumination is an illumination mode produced by a mix between quadrapole and annular illumination.

As described in further detail below, the present invention provides significant advantages over the prior art. Most importantly, the present invention provides for a simple and effective process for the removal of assist features ("AFs") utilized, for example, to solve the forbidden pitch problem. Thus, the present invention prevents a degradation in the DOF and process latitude that would be associated with the AFs if such AFs were not removed from the substrate. In addition, by utilizing the quadrapole illumination in the "washing" step, both vertical and horizontal assist features can be removed in a single exposure.

Furthermore, as a result of the method of the present invention, the AFs can be removed for the entire focus range, and the main features are not deteriorated during the assist removal process (i.e. main feature process window is not reduced). This is due to the fact that the washing step has little or no light at the location of the main features (even for defocus values).

It will be appreciated that in the present invention, the "mask pattern" may be embodied in a mask but may also be applied using another type of patterning means, examples of which are mentioned above. The term "mask pattern" is used herein for convenience but should not be construed as requiring the presence of a mask, unless the context otherwise requires.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

Additional advantages of the present invention will become apparent to those skilled in the art from the following detailed description of exemplary embodiments of the present invention.

BRIEF DESCRIPTION OF THE DRAWINGS

The invention itself, together with further objects and advantages, can be better understood by reference to the following detailed description and the accompanying drawings, in which:

FIGS. 4a–4d illustrate an attempt to eliminate the AFs utilizing a y-dipole illumination.

DETAILED DESCRIPTION OF THE DRAWINGS

Figure 1:
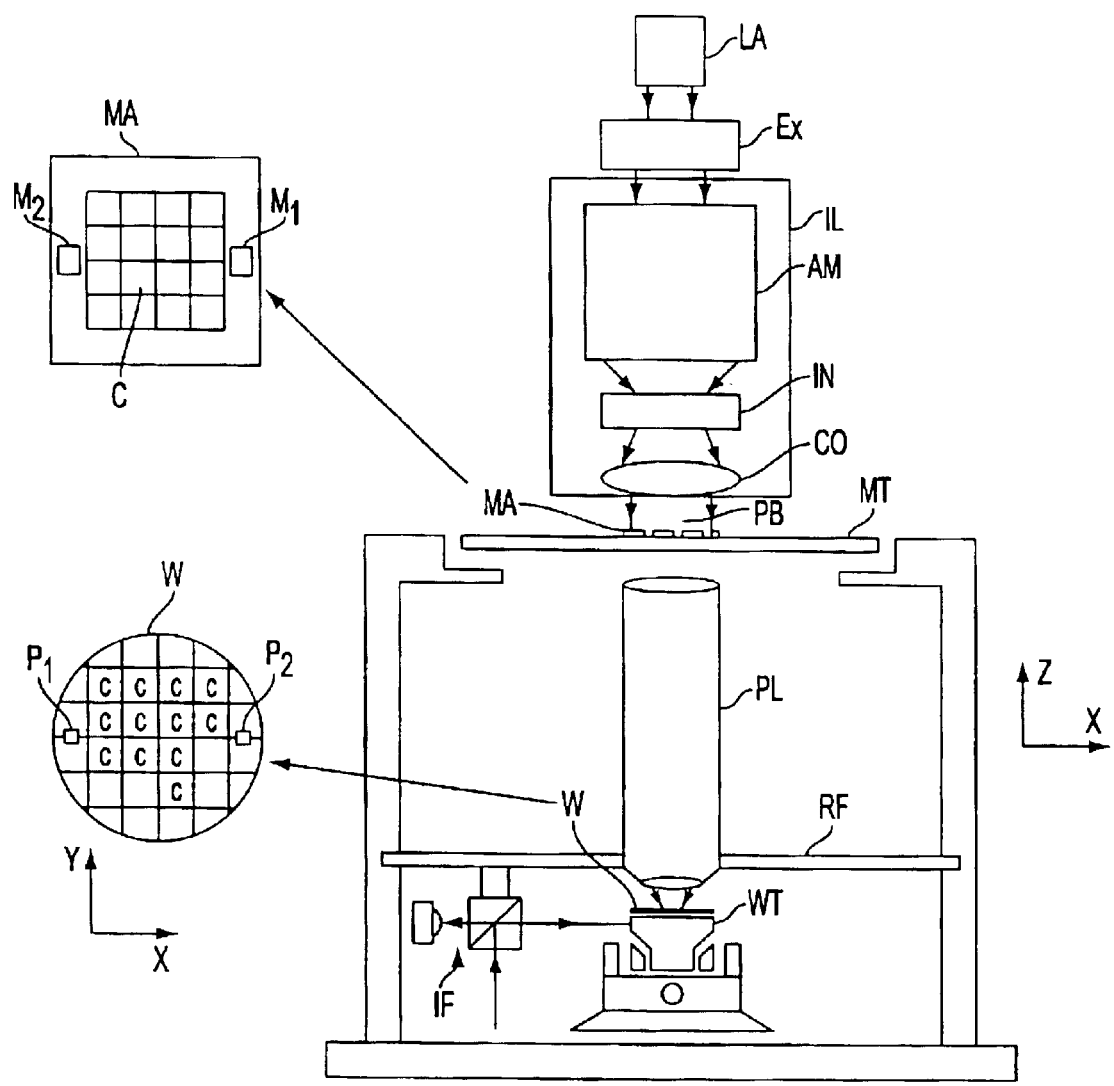
FIG. 1 illustrates an exemplary lithographic projection apparatus.

FIG. 1 schematically depicts an exemplary lithographic projection apparatus suitable for use with a AF removal process of the present invention. The apparatus comprises:

a radiation system Ex, IL, for supplying a projection beam PB of radiation. In this particular case, the radiation system also comprises a radiation source LA;

a first object table (mask table) MT provided with a mask holder for holding a mask MA (e.g. a reticle), and connected to first positioning means for accurately positioning the mask with respect to item PL;

a second object table (substrate table) WT provided with a substrate holder for holding a substrate W (e.g. a resist-coated silicon wafer), and connected to second positioning means for accurately positioning the substrate with respect to item PL;

a projection system ("lens") PL (e.g. a refractive, catoptric or catadioptric optical system) for imaging an irradiated portion of the mask MA onto a target portion C (e.g. comprising one or more dies) of the substrate W.

As depicted herein, the apparatus is of a transmissive type (i.e. has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g. a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g. with the aid of suitable directing mirrors); this latter scenario is often the case when the source LA is an excimer laser (e.g. based on KrF, ArF or $F_2$ lasing). The current invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means P1, P2 (and interferometric measuring means IF), the substrate table WT can be moved accurately, e.g. so as to position different target portions C in the path of the beam PB. Similarly, the first positioning means M1, M2 can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan tool) the mask table MT may just be connected to a short stroke actuator, or may be fixed.

The depicted tool can be used in two different modes:

In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

As noted above, FIGS. 2a–2c illustrate how the DOF is degraded due to the forbidden pitch phenomena. More specifically, FIG. 2a corresponds to an imaging result of a line:space pattern having a line width of 70 nm and a pitch of 170 nm, utilizing illumination settings of NA=0.85; exposure wavelength=193 nm; dipole 35x; sigma_outer= 0.82 and sigma_inner=0.52. It is noted that dipole 35x corresponds to dipole illumination with the poles disposed along the X axis, whereby the outer edge of each pole subtend at an angle of 35 degrees with the origin point situated at the midpoint between the poles. In addition, sigma_outer corresponds to the outer (maximum) value of the coherency factor σ, and sigma_inner corresponds to the inner (minimum) value of the coherency factor σ. As shown in FIG. 2a, the acceptable DOF obtainable by this line:space pattern is approximately +/−350 nm in the Z-direction before the image begins to degrade (the ED (exposure latitude-DOF) plot in FIG. 2c shows that DOF is even more than 700 nm).

Figure 2C:
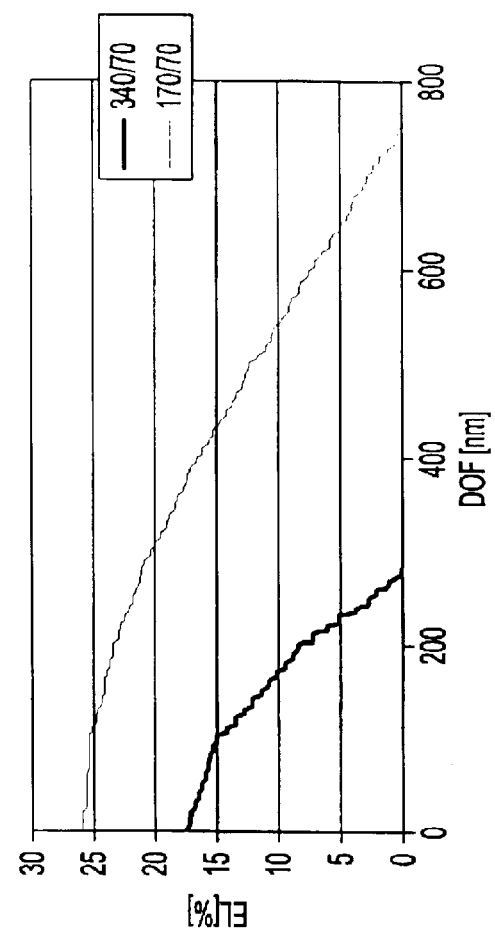
FIGS. 2a–2c illustrate how the DOF is degraded due to the forbidden pitch phenomena.
Figure 2A:
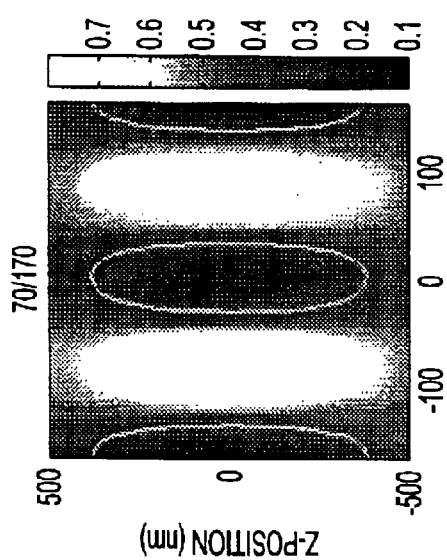
Figure 2B:
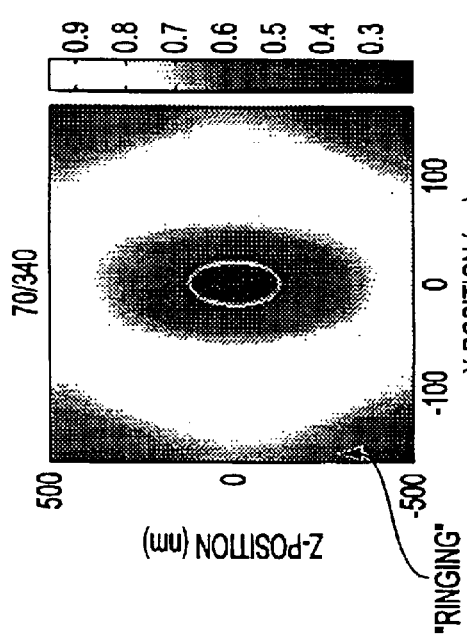

FIG. 2b illustrates the problems/degradation in acceptable DOF that occurs at a forbidden pitch. More specifically, FIG. 2b corresponds to the imaging result from a line:space pattern having a line width of 70 nm and a pitch of 340 nm, utilizing the same illumination settings as noted above with FIG. 2a. As shown, at this "forbidden pitch" of 340 nm, the acceptable DOF is significantly reduced to approximately +/−100 nm in the Z-direction. It is noted that "forbidden pitch" problems are particularly relevant when utilizing strong off-axis techniques, such as, dipole illumination.

FIG. 2c is a graphical comparison illustrating the degradation of the DOF that occurs at the forbidden pitch. As shown, while the line:space ratio of 70/170 exhibits an exposure latitude of approximately 24% at a DOF of 200 nm, the forbidden pitch (i.e., line:space ratio of 70/340) exhibits an exposure latitude of only approximately 8%.

Figure 3A:
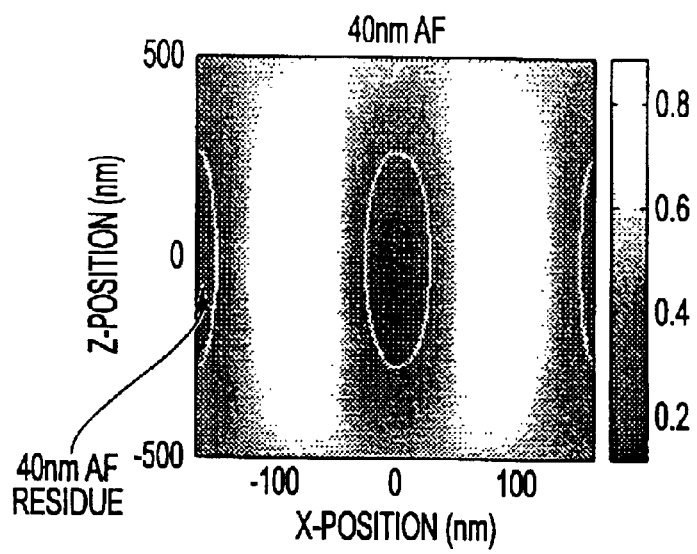
FIGS. 3a–3b illustrate how AFs can be utilized to negate the forbidden pitch phenomena.
Figure 3B:
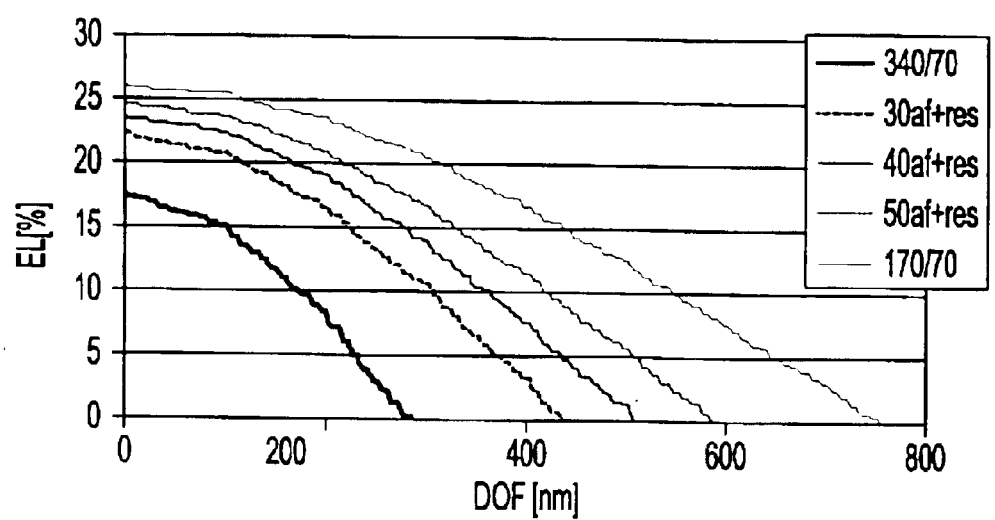

FIGS. 3a–3b illustrate how the use of AFs can improve the DOF at forbidden pitches as disclosed in the '305 application noted above. FIG. 3a corresponds to the imaging result of line:space pattern having a line width of 70 nm and a pitch of 340 nm, utilizing the same illumination settings as noted above with FIG. 2a, with the addition of 40 nm AFs placed adjacent the lines contained in the given pattern. As shown in FIG. 3b, the addition of the assist features to the mask pattern results in a substantial improvement of the DOF, as the resulting image prints in a manner more similar to the dense features of FIG. 2a. However, while the DOF is improved, there is also some unwanted residue of the AF on the printed wafer. In other words, a portion of the AF is printed, which is undesirable.

FIG. 3b is a graph illustrating the results associated with utilizing various size AFs to improve the DOF at the forbidden pitch corresponding to the line:space ratio of 70:340 nm. As shown, as the size (i.e., width) of the AF is increased, the DOF at the forbidden pitch increases toward the DOF corresponding to the dense feature of FIG. 2a. However, for each of the AFs, there is also unwanted printing (i.e., residue) of the AF.

Figure 4D:
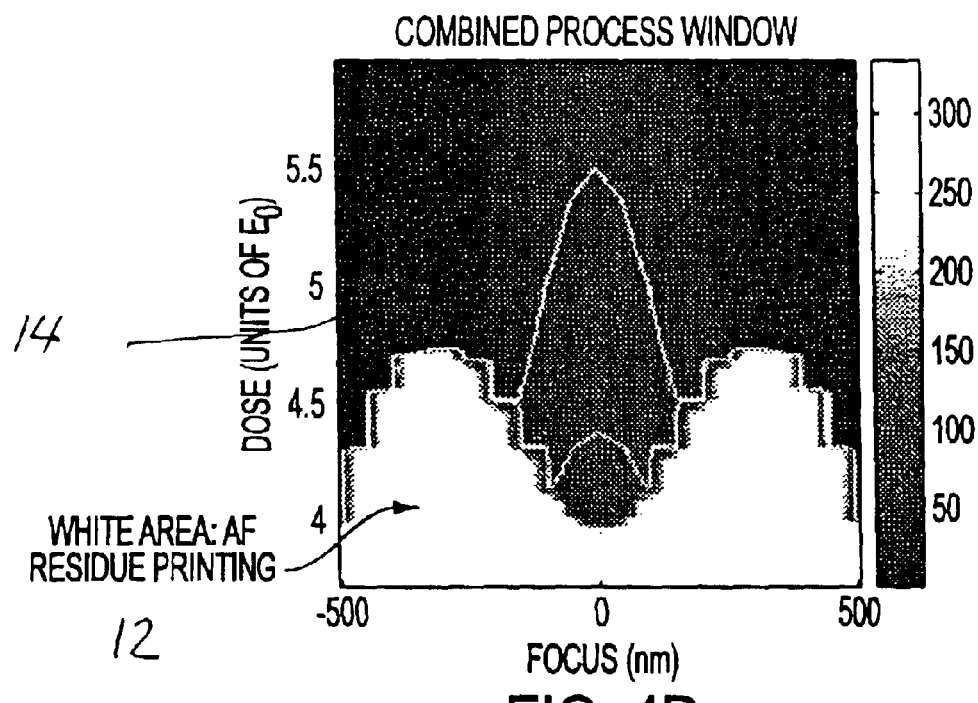

Typically, when utilizing dipole illumination, an x-dipole illumination is first performed in order to print the vertical features and then a y-dipole illumination is performed to print the horizontal features. It is noted, however, that even when the subsequent y-dipole illumination is utilized, the vertical assist features are still not fully removed from the wafer. It is further noted that in order for the y-dipole exposure to have a chance of removing the AFs, the exposure must be performed utilizing a mask that is locally open at the locations where the AF residues are located. The foregoing is illustrated in FIGS. 4a–4d. It is noted that the illumination conditions utilized to generate the images shown in FIGS. 4a–4d were the same as those set forth above with regard to FIGS. 2a–2c, and the assist features utilized have a width of 40 nm. FIG. 4a illustrates the image resulting from the x-dipole illumination, which is the same as that shown in FIG. 3a. FIG. 4b illustrates the image resulting from the y-dipole illumination utilizing a corresponding mask, and FIG. 4c illustrates the image resulting from the combination of both illuminations. FIG. 4d illustrates the resulting process window corresponding to the image of FIG. 4c. As shown, when utilizing only the x-dipole and y-dipole illuminations, AF residue still prints on the wafer, and therefore limits the DOF.

Referring to FIG. 4d, the x-axis represents the focus and the y-axis represents the minimum energy dose required to remove AF residue. The white area 12 represents the combinations of focus and dose for which the AF residues are expected to print. The area 14 that is indicated by the thin white border are the dose and focus combinations that result in a main feature whose size is sufficiently good to target. As such, it can be seen that the DOF is limited to approximately +/−150 nm. It is noted that the cone-shape portion of FIG. 4d represents the available process latitude.

More specifically, the central area that is surrounded by the line 14 corresponds to the process window. It indicates that all combinations of focus and exposure dose that lie within this process window will yield an acceptable CD of the main feature (typically acceptable CD ranges are within a +/−10% of target). Ideally, it is desirable to have the process window as large as possible, since that would mean that the process is very insensitive to dose or focus errors. The area 12 in the bottom of FIG. 4d indicates the focus and dose combinations that will result in the printing of the AFs. It is noted that FIG. 4d was based on aerial image calculations. In an actual system, the properties of the coating will alter this area 12. However, such aerial image calculations are useful for predicting the behavior, as well as variations due to changes in illumination schemes.

Referring again to FIG. 4*d*, there are two main factors that limit the DOF. The first is that the process window is quite narrow. This is due to the fact that the dipole-y exposure (as shown in FIG. 4*b*) has the property that at the location of the main feature (i.e., x=0 in the figure) for out of focus situations, some bright areas exist. These bright areas will deteriorate the defocus main feature image, thereby reducing DOF. The second, less important, DOF limiter, is that some AFs will print for some combinations that lie within the main-feature process window. This makes these focus/dose combinations "fail", and therefore limits process latitude, in this case DOF.

It is noted that the applicants of the present invention have determined that the reasons that the second exposure utilizing the opposite dipole does not effectively remove the AFs include unsatisfactory DOF of washing exposure and unsatisfactory darkness at the main feature position for defocus.

Accordingly, in view of the foregoing, it has been determined that the optimal washing conditions are those which result in extreme darkness at the main feature and a DOF comparable to the targeted DOF main feature. In other words, the optimal washing conditions are those which: (A) result in extreme darkness at the main feature for the entire focus range in which the main feature exists (this is required in order not to deteriorate the main feature image, and (B) have sufficient washing "brightness" to remove the AF residue image for all focus values where AF residue exists. This criteria can be accomplished utilizing a quadrapole illumination as a washing step after performing the first and second exposures of the wafer utilizing the x-dipole and y-dipole illumination, respectively. In the preferred embodiment of the present invention, the quadrapole illumination utilized is a QUASAR™ illumination.

More specifically, in accordance with the process of the present invention, after performing the x-dipole illumination with the V-reticle and the y-dipole illumination with the H-reticle, a third illumination is performed utilizing a QUASAR™ illumination with yet another reticle. (It is noted that it is sometimes possible for the three reticles to be combined on one reticle if the chip is small enough so that three separate images fit on one mask. In such an instance, another portion of the mask is exposed as opposed to a separate reticle). As explained below, the QUASAR™ illumination is a "washing" exposure that effectively removes substantially all AF residue that remains subsequent to the foregoing dipole illuminations. As a result, by performing the QUASAR™ illumination, it is possible to provide a significant improvement in the minimum DOF and process latitude obtainable with the given illumination settings.

Referring to FIGS. 5*a*–5*d*, FIG. 5*a* represents the resulting image obtained by utilizing an x-dipole illumination with the same illumination settings and assist features as described above with regard to FIG. 4*a*. It is noted that while not shown in FIGS. 5*a*–5*d*, in the given embodiment, the same y-dipole illumination as detailed above in conjunction with FIG. 4*b* is performed.

It is noted that whether or not both printing illuminations (i.e., x-dipole and y-dipole) are necessary depends on the given application. In some instances only one printing illumination may be utilized, along with the washing illumination. Thus, if the main features of the design require double dipole illumination, then the y-dipole illumination will also be utilized. However, the second dipole illumination is not utilized for washing. In other words, even if the y-dipole illumination is used to exposure some horizontal main features, the reticle that is used in that exposure will be dark at the location of the AFs of the other dipole exposure.

Furthermore, it is also noted that the order of the exposures does not have any impact at all, and therefore may be varied. Accordingly, possible illumination schemes include: dipole-x+dipole-y+quasar; dipole-x+quasar+dipole-y; quasar+dipole-y+dipole-x; quasar+dipole-x+dipole-y; dipole-y+dipole-x+quasar; and dipole-y+quasar+dipole-x.

Figure 5D:
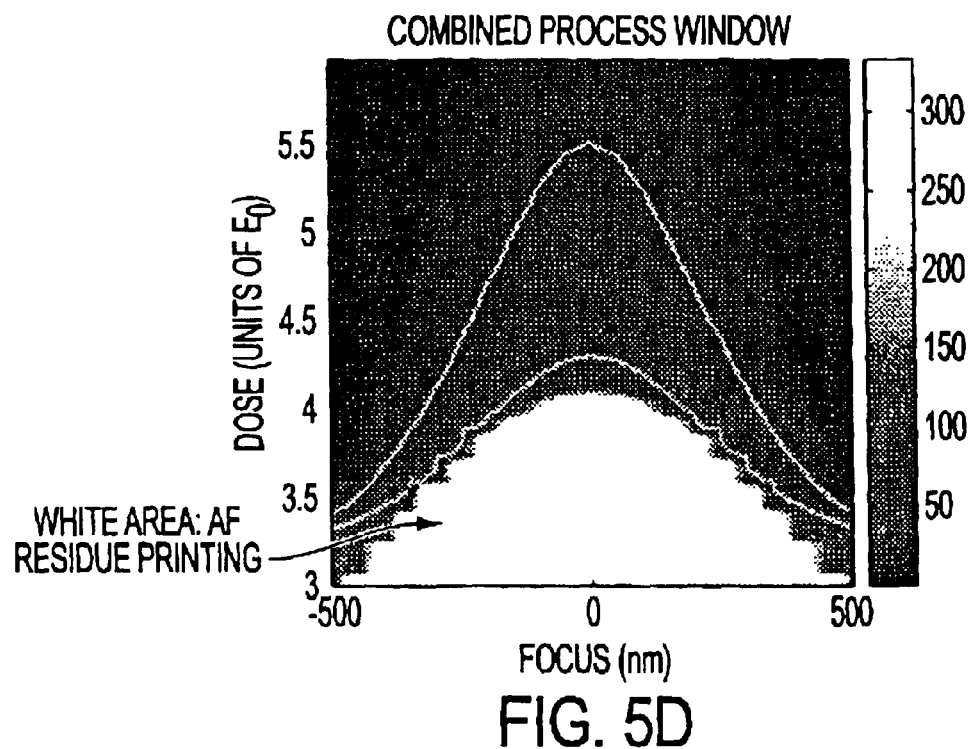
FIGS. 5a–5d illustrate the process of eliminating the AFs utilizing QUASAR illumination in accordance with the present invention.
Figure 5C:
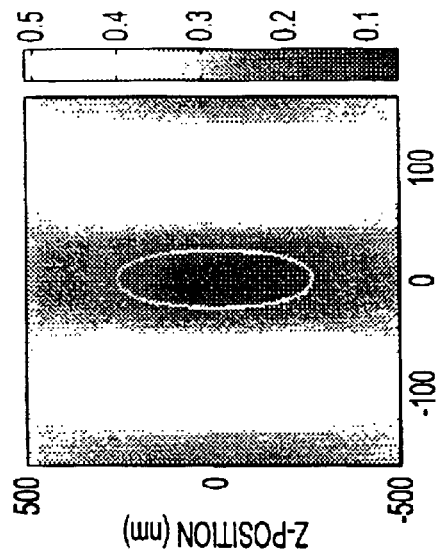
Figure 5B:
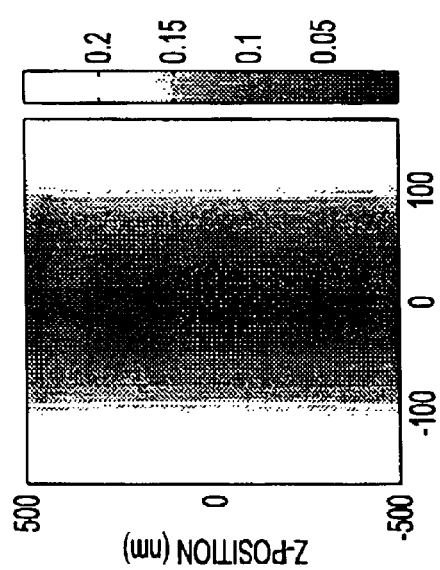
Figure 5B:
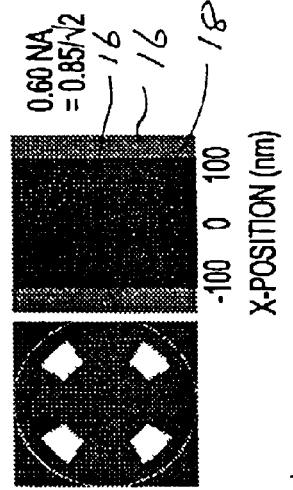

FIG. 5*b* illustrates exemplary QUASAR™ illumination settings utilized to remove the AF residue and the corresponding resulting image. As shown, the QUASAR™ illumination settings include a NA equal to 0.60. FIG. 5*c* illustrates the image resulting from the combination of the three illuminations (i.e., x-dipole, y-dipole and QUASAR™), and FIG. 5*d* illustrates the resulting process window corresponding to the image of FIG. 5*c*. It is noted that the optimal illumination settings for the washing step depend on the exact layout of the reticle and the assist features utilized in the design.

For example, the 0.60 NA of the present example was selected based on the assumption that the AF was set at a pitch that best suits the dipole mode. This means that the AF distance (not including the main feature) has a pitch that is twice the smallest pitch that will be used with the dipole. In order to print that double pitch washing exposure with high contrast and DOF, the physical location of the illumination poles with respect to the x axis should be half of that of the dipole. When utilizing QUASAR™ instead of dipole at the same NA the poles move in x direction by a factor of sqrt(2). Therefore, in order to place the poles exactly at half the distance from the y axis, the NA must also shrink with a factor sqrt(2).

Of course, there are also other NA, sigma combinations that will yield an identical result. Indeed, as long as the product of NA*sigma is constant, the physical angle under which the light hits the reticle remains the same. In other words, NA=0.60, sigma_out=0.82, sigma_in=0.52 is identical to NA=0.62 and sigma_out=0.82*0.6/0.62=0.79 and sigma_in=0.52*0.6/0.62=0.5.

Referring to FIG. 5*d* in comparison to FIG. 4*d*, it is shown that the printing of AF residue is significantly reduced by performing the "washing" illumination utilizing the quadrapole, QUASAR™ illumination. As a result of the foregoing process of the present invention, the resulting process window is significantly wider as can be seen from a comparison between FIGS. 5*d* and 4*d*. (This results from the fact that in the image of FIG. 5*b* the "light-blobs" at x=0 for some defocus do not exist as they do in the image of FIG. 4*b*).

Figure 5A:
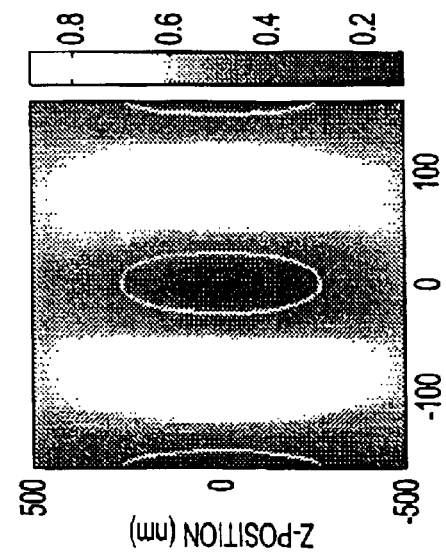
Figure 5A:
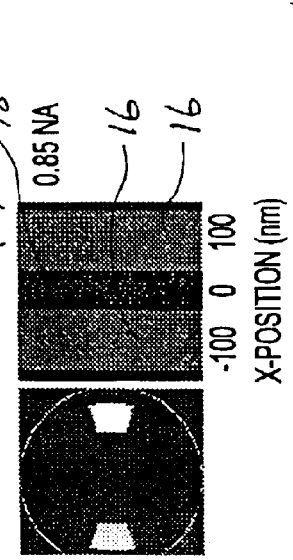

It is noted that when selecting the quadrapole illumination settings to be utilized in the "washing" step, the "washspace" size is first tuned to the lowest value that removes AF residues from the process window. The washing-space (also referred to as a washing-slit) is the open portion of the reticle that is used for the washing exposure. The washing slit is located at the same position where the AF was located in the printing exposure. Referring to FIGS. 5*a* and 5*b* and the portions of the figures adjacent the dipole, the area 16 means open (i.e. light goes through), and the area 18 means chromium on mask, dark.

Figure 8:
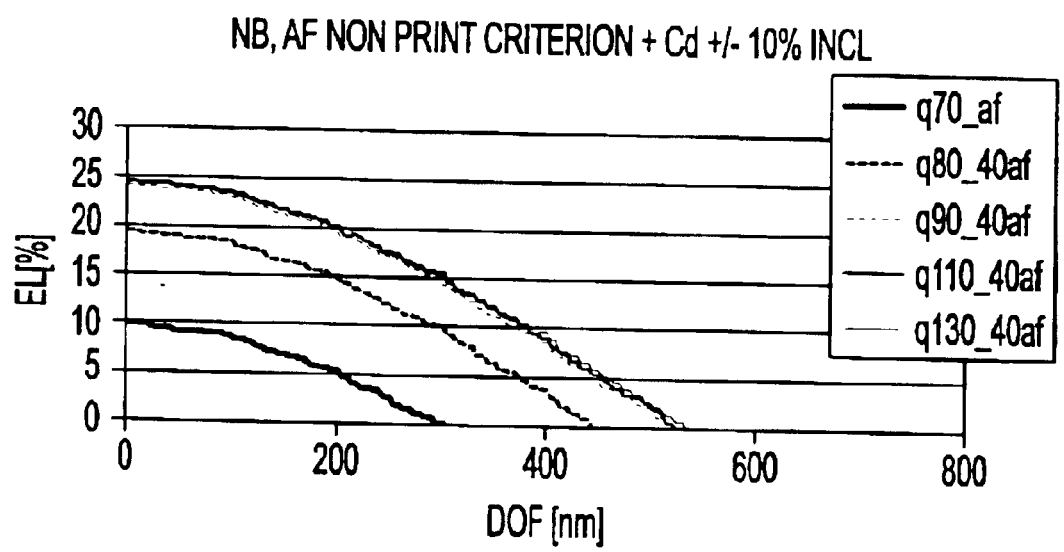
FIG. 8 illustrates the improvement obtained in the DOF and overall process latitude by utilizing the method of the present invention to remove AF residue.

It is noted that the wash-space should be large enough to successfully remove the AF residues, but not larger than that so as to avoid possible negative effects (e.g., impact on the main feature or flare). This is illustrated by the graphs set forth in FIG. 8. Referring to FIG. 8, when the wash-space is only 70 or 80 nm, the AF residues still print, thereby limiting the process window. However, with a 90 nm wash-space, the AF residues are substantially eliminated and, as a result, there is a substantial improvement in the maximum process window. Increasing the wash-space beyond 90 nm does not result in a further improvement in the process window.

Figure 6C:
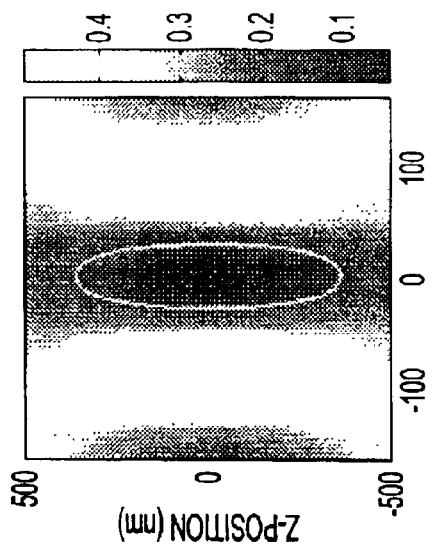
FIGS. 6a–6d illustrate how a modification of the mask utilized in the washing process can further optimize the DOF and process latitude obtained by the present invention.
Figure 6B:
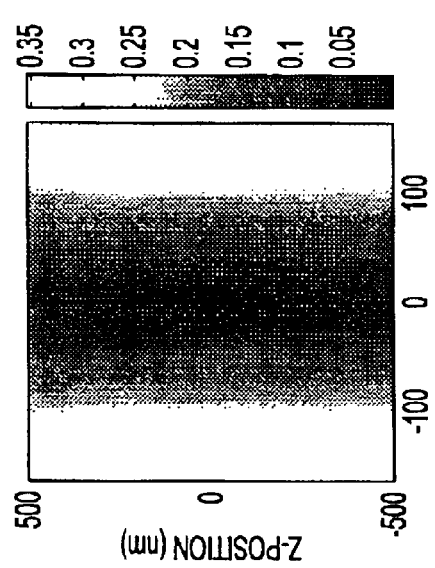
Figure 6B:
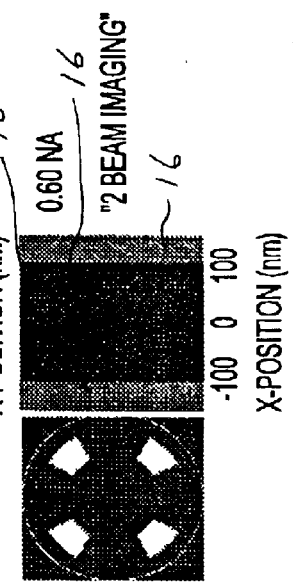
Figure 6A:
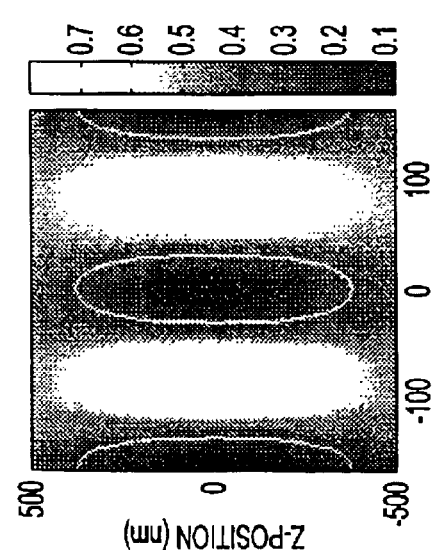
Figure 6A:
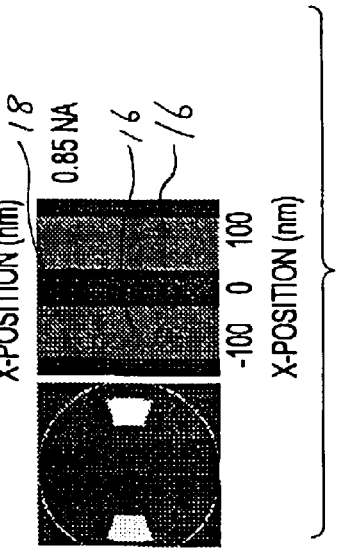
Figure 6D:
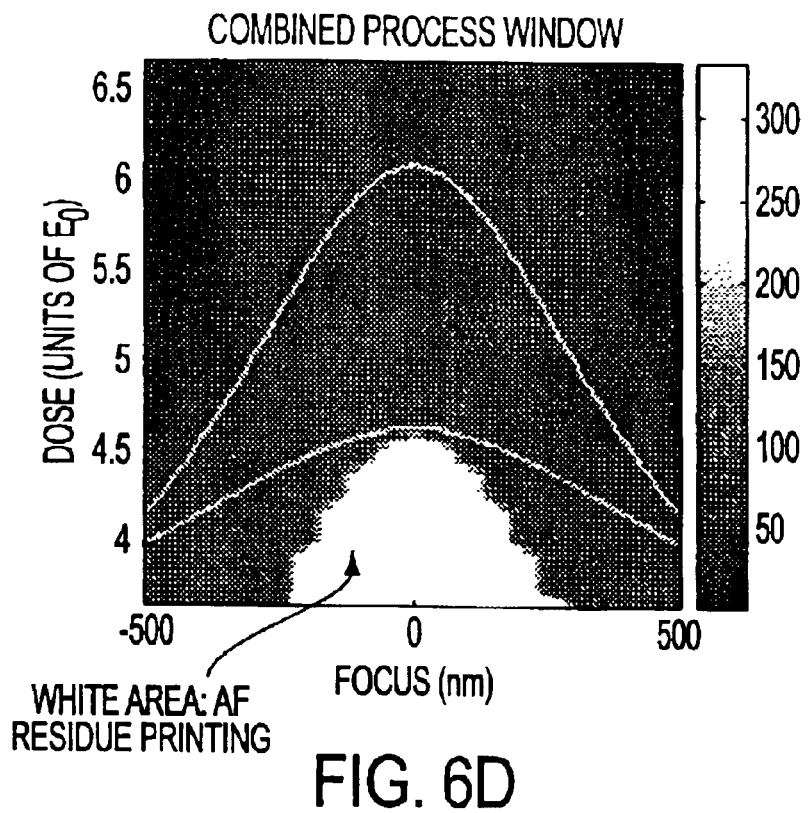

FIGS. 6a–6d illustrate the results of the "washing" exposure when the wash-space size is set to 110 nm. All other illuminations settings remain the same as that illustrated and utilized in conjunction with FIGS. 5a–5d. Referring to FIG. 6d, it is shown that for the given example by tuning the wash-space size to 110 nm, it is possible to significantly reduce AF residue printing and, as a result, further improve the DOF (the DOF gain is achieved by the larger AF that are equal in size with the main feature) and process latitude for a given set of illumination conditions. The foregoing is clear from a comparison of FIG. 5d and FIG. 6d. The basic concept is that because the residues are to be removed, the residues may be large. This allows for the use large AFs (e.g., scatter bars). Indeed, the AFs can be as large as the main feature. However, it is noted that when utilizing large AFs, the wash exposure needs to be boosted (i.e., enlarging the wash-space in order to clean up residues), which gives the 110 nm wash space for this case.

It is noted that the mask (i.e., reticle) utilized when performing the "washing" exposure utilizing QUASAR™ illumination is simply a biased negative of all AFs contained on the V-reticle and H-reticle utilized during the x-dipole exposure and the y-dipole exposure, respectively. It is noted that as is known, the V-reticle is a reticle containing mainly vertical features, and the H-reticle is a reticle containing mainly horizontal features.

Figure 7:
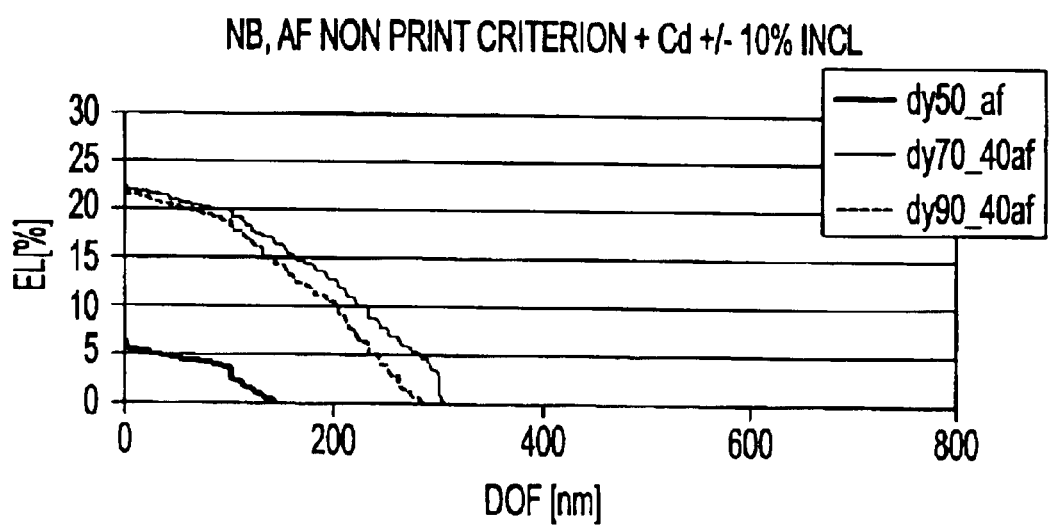
FIG. 7 illustrates the results obtained by utilizing a y-dipole illumination as the "washing" step to remove AF residue.

The charts set forth in FIGS. 7 and 8 summarize the improvement in the DOF and overall process latitude that is obtainable utilizing the method of the present invention. More specifically, FIG. 7 illustrates the DOF obtained when the y-dipole illumination is utilized as the AF "washing" exposure. It is noted that FIG. 7 corresponds to a pattern having a line to space ratio of 70:340 and which utilizes 40 nm AF, and which is illuminated utilizing the same illumination conditions as described above with regard to FIG. 2a. Further, as shown in FIG. 7, the slit in the washing layer (i.e., wash-space) is varied between 50, 70 and 90 nm.

FIG. 8 illustrates the resulting DOF when the third "washing" exposure is performed utilizing QUASAR™ illumination in accordance with the present invention. The results are provided for "wash-space" sizes of 70, 80, 90, 110 and 130 nm. As shown, each of the results obtained utilizing the QUASAR™ illumination as a third "washing" exposure results in a significant improvement as compared to the results obtained utilizing y-dipole illumination as a washing step as illustrated in FIG. 7.

As described above, the method of the present invention provides significant advantages over the prior art. Most importantly, the present invention provides for a simply and effective process for the removal of AFs utilized, for example, to solve the forbidden pitch problem, thereby preventing a degradation in the DOF and process latitude that would be associated with the AFs if such AFs were not removed. Moreover, by utilizing the QUASAR™ illumination both the vertical AFs and the horizontal AFs can be removed utilizing a single "washing" exposure.

Although certain specific embodiments of the present invention have been disclosed, it is noted that the present invention may be embodied in other forms without departing from the spirit or essential characteristics thereof. The present embodiments are therefor to be considered in all respects as illustrative and not restrictive, the scope of the invention being indicated by the appended claims, and all changes that come within the meaning and range of equivalency of the claims are therefore intended to be embraced therein.

What is claimed is:

1. A method of transferring a lithographic pattern onto a substrate by use of a lithographic apparatus, said method comprising the steps of:
   defining features to be printed on said substrate;
   determining which of said features require assist features to be disposed adjacent thereto in order for said features to be printed within defined resolution limits;
   generating a mask containing said features to be printed and said assist features;
   performing a first illumination process so as to print said features on said substrate, said first illumination process resulting in the partial printing of said assist features on said substrate, said first illumination process including a dipole illumination of said substrate; and
   performing a second illumination process so as to reduce the amount of said assist features printed on said substrate; said second illumination process comprising the step of performing a quadrapole illumination.

2. The method of transferring a lithographic pattern onto a substrate according to the method of claim 1, wherein said second illumination process comprises a QUASAR™ illumination.

3. The method of transferring a lithographic pattern onto a substrate according to the method of claim 1, wherein the sequence in which said first illumination process and said second illumination process are performed is interchangeable.

4. The method of transferring a lithographic pattern onto a substrate according to the method of claim 1, wherein said dipole illumination includes performing a first exposure of said substrate utilizing a x-dipole illumination, and a second exposure of said substrate utilizing a y-dipole illumination.

5. The method of transferring a lithographic pattern onto a substrate according to the method of claim 1, wherein said second illumination process utilizes a mask having a pattern formed therein, which is a biased negative of a pattern defined by the assist features contained in said mask.

6. The method of transferring a lithographic pattern onto a substrate according to the method of claim 1, wherein substantially all of said assist features printed on said substrate as a result of said first illumination process are removed from said substrate by said second illumination process.

7. The method of transferring a lithographic pattern onto a substrate according to the method of claim 1, wherein said assist features include assist features aligned in a first direction and assist features aligned in a second direction, said first direction and said second direction being orthogonal to one another.

8. The method of transferring a lithographic pattern onto a substrate according to the method of claim 7, wherein said second illumination process substantially removes both said assist features aligned in said first direction and said assist features aligned in said second direction.

9. A device manufacturing method comprising the steps of:
   providing a substrate that is at least partially covered by a layer of radiation sensitive material;
   providing a projection beam of radiation using a radiation system;

using patterning means to endow the projection beam with a pattern in its cross-section, said patterning means includes features to be printed on said substrate and assist features disposed adjacent at least one of said features to be printed, said assist features performing optical proximity correction;

projecting the patterned beam of radiation onto a target portion of the layer of radiation-sensitive material including a first illumination process so as to print said features on said substrate, said first illumination process resulting in the partial printing of said assist features on said substrate, said first illumination process including a dipole illumination of said substrate; and performing a second illumination process so as to reduce the amount of said assist features printed on said substrate; said second illumination process comprising the step of performing a quadrapole illumination.

10. The device manufacturing method of claim 9, wherein said second illumination process comprises a QUASAR™ illumination.

11. The device manufacturing method of claim 9, wherein the sequence in which said first illumination process and said second illumination process are performed is interchangeable.

12. The device manufacturing method of claim 9, wherein said dipole illumination includes performing a first exposure of said substrate utilizing a x-dipole illumination, and a second exposure of said substrate utilizing a y-dipole illumination.

13. The device manufacturing method of claim 9, wherein said second illumination process utilizes a mask having a pattern formed therein, which is a biased negative of a pattern defined by the assist features contained in said mask.

14. The device manufacturing method of claim 9, wherein substantially all of said assist features printed on said substrate as a result of said first illumination process are removed from said substrate by said second illumination process.

15. The device manufacturing method of claim 9, wherein said assist features include assist features aligned in a first direction and assist features aligned in a second direction, said first direction and said second direction being orthogonal to one another.

16. The device manufacturing method of claim 15, wherein said second illumination process substantially removes both said assist features aligned in said first direction and said assist features aligned in said second direction.

* * * * *